US006094014A

United States Patent [19]

Bucks et al.

[11] Patent Number: 6,094,014

[45] Date of Patent: Jul. 25, 2000

[54] CIRCUIT ARRANGEMENT, AND SIGNALING LIGHT PROVIDED WITH THE CIRCUIT ARRANGEMENT

[75] Inventors: Marcel J. M. Bucks; Engbert B. G. Nijhof, both of Eindhoven, Netherlands

[73] Assignee: U.S. Philips Corporation, New York, N.Y.

[21] Appl. No.: 09/128,148

[22] Filed: Aug. 3, 1998

[30] Foreign Application Priority Data

Aug. 1, 1997 [EP] European Pat. Off. .............. 97202400

[51] Int. Cl.[7] .............. G05F 1/00

[52] U.S. Cl. .............. 315/291; 315/307; 315/169.3; 363/25; 363/89; 323/222; 323/282

[58] Field of Search .............. 315/169.3, 291, 315/307, 290, 287; 323/222, 282, 351; 363/15, 25, 89, 80, 81, 126

[56] References Cited

U.S. PATENT DOCUMENTS

| | | | |
|---|---|---|---|
| 4,291,254 | 9/1981 | Arlt et al. | 315/240 |
| 4,403,157 | 9/1983 | Guajardo et al. | 327/520 |
| 4,595,861 | 6/1986 | Simopoulos et al. | 315/169.3 |
| 4,654,629 | 3/1987 | Bezos et al. | 246/473.3 |
| 5,656,925 | 8/1997 | Schie et al. | 323/222 |
| 5,661,645 | 8/1997 | Hochstein | 363/89 |

*Primary Examiner*—Haissa Philogene
*Attorney, Agent, or Firm*—Robert J. Kraus; Edward W. Goodman

[57] ABSTRACT

A circuit arrangement for operating a semiconductor light source, includes input terminals for connecting a supply voltage, an input filter, a converter having a control circuit, and output terminals for connecting the semiconductor light source. The circuit arrangement is provided with a voltage detector for detecting the output voltage at the output terminals.

7 Claims, 1 Drawing Sheet

CIRCUIT ARRANGEMENT, AND SIGNALING LIGHT PROVIDED WITH THE CIRCUIT ARRANGEMENT

BACKGROUND OF THE INVENTION

1. Field of the Invention

The invention relates to a circuit arrangement suitable for operating a semiconductor light source and provided with:

input terminals for connecting a supply voltage, input filter means, a converter comprising a control circuit, and output terminals for connecting the semiconductor light source.

2. Description of the Related Art

The invention also relates to a signaling light provided with such a circuit arrangement.

Semiconductor light sources are increasingly used for signaling lights. A semiconductor light source has the advantage over a usual incandescent lamp in such an application that it has a considerably longer life and a considerably lower power consumption than the incandescent lamp. Signaling lights often form part of a complicated signaling system, for example, a traffic control system with traffic lights. Semiconductor light sources, in general, have the property that the operation as a light source is determined by the value of the current supplied to the semiconductor. The converter should accordingly, act as a current generator. A disadvantage of this is that a very high voltage may arise at the output terminals in the case of a defective semiconductor light source. If operation continues for a long time in such a condition, there is a risk of breakdown in the circuit arrangement, so that it becomes defective. Neither is the probability of short-circuits occurring a negligible one, with all the risks this involves.

SUMMARY OF THE INVENTION

It is an object of the invention to provide a circuit arrangement of the kind described in the opening paragraph in which the above disadvantage is avoided.

According to the invention, this object is achieved in a circuit arrangement of the kind mentioned in the opening paragraph in that the circuit arrangement is provided with voltage detection means for voltage detection at the output terminals. An advantage of the measure according to the invention is that a direct check of the voltage level occurring at the output terminals of the converter is possible. This renders possible not only a detection of a defective semiconductor light source, but indeed, any disturbance of a safe operation of the converter.

Preferably, the voltage detection means generates a signal S if a voltage Vu appears the output terminals which is higher than a threshold voltage Vud. This has the advantage that it can be detected whether the impedance of the connected semiconductor light source has risen. A semiconductor light source in general, comprises a matrix of semiconductors, for example, in the form of LEDs, which are electrically interconnected. A defect in one or a few of the semiconductors will already give rise to an increased impedance of the light source. Although the increase in the voltage at the output terminals in itself need not be detrimental to the operation of the converter, the lumen output of the light source may drop as a result of this to such an extent that it no longer forms a reliable signaling light. Given a suitable choice of the threshold voltage level Vud, this detection has the advantage that it is suitable as a detection of whether the semiconductor light source is wholly or partly defective.

In an advantageous embodiment of the circuit arrangement according to the invention, the input filter means is provided with switching means for switching the converter into an operational state for which it is true that Vu<Vud. This renders it possible to prevent an overload on the converter in a simple and reliable manner. The reliability is in particular, safeguarded by the use of switching means which is separate from the converter. The reliability is further enhanced in a preferred embodiment in which the switching means comprises disconnecting means, and the signal S serves for operating the converter in an operational state for activating the disconnecting means. An advantage of this is that the control circuit may be comparatively simple while a full separation between the control circuit of the converter, on the one hand and the switching means of the input filter means, on the other hand, is realized, whereby a reliable and controlled disconnection of the converter is safeguarded. A further improvement in the reliability of the disconnection of the converter can be advantageously achieved in that the switching means is constructed as a fuse. It is necessary for the circuit arrangement to have retrofit possibilities with respect to existing signaling systems in order to realize the above advantages of semiconductor light sources on a wide scale. The use of the fuse advantageously realizes a condition at the connection terminals comparable to a defective incandescent lamp when the converter has been disconnected by the disconnecting means. The use of a semiconductor light source as a replacement for an incandescent lamp is further promoted thereby.

In an advantageous embodiment, the circuit arrangement according to the invention is suitable for connection to a solid state relay, and a self-regulating current limitation network is connected between the input filter means and the converter. The self-regulating current limitation network will also be disconnected when the converter is disconnected by the disconnecting means. An advantage of this is that a situation arises again under these circumstances comparable to a defective incandescent lamp. This may be explained as follows. Traffic control systems provided with traffic lights are usually fitted with a so-called conflict monitor which regularly measures the voltage between connection terminals of a relevant traffic light. The control of the traffic light usually takes place by means of a solid state relay. When the solid state relay is non-conducting, a small leakage current will usually flow. If the traffic light is an incandescent light, it will have a low impedance and accordingly, the leakage current flowing through the lamp will not lead to an appreciable rise in the voltage between the connection terminals. If the incandescent lamp is defective, on the other hand, its impedance is very high, which means that the occurrence of the leakage current leads to a considerable rise in the voltage between the connection terminals. The voltage between the connection terminals thus forms an indication for the conflict monitor as to whether the connected lamp is defective or not. In the present description, the term “converter” is understood to mean an electrical circuit with which an electrical power supplied by the supply source is converted into a current/voltage combination required for operating the semiconductor light source. Preferably, a switched mode power supply provided with one or several semiconductor switches is used as such. Since modern switch mode power supplies are usually DC—DC converters, it is preferable for the input filter means to be provided also with rectifying means which is known per se.

Preferably, a signaling light provided with a housing containing a semiconductor light source according to the invention is also provided with the circuit arrangement according to the invention. The possibilities of using the signaling light as a retrofit unit for an existing signaling light are strongly enhanced in this manner. The application possibilities as a retrofit signaling light are an optimum if the circuit arrangement is provided with a housing which is integrated with the housing of the signaling light.

BRIEF DESCRIPTION OF THE DRAWING

The above and further aspects of the invention will be explained in more detail below with reference to a drawing of an embodiment of the circuit arrangement according to the invention, in which.

DESCRIPTION OF THE PREFERRED EMBODIMENT

Figure 1:
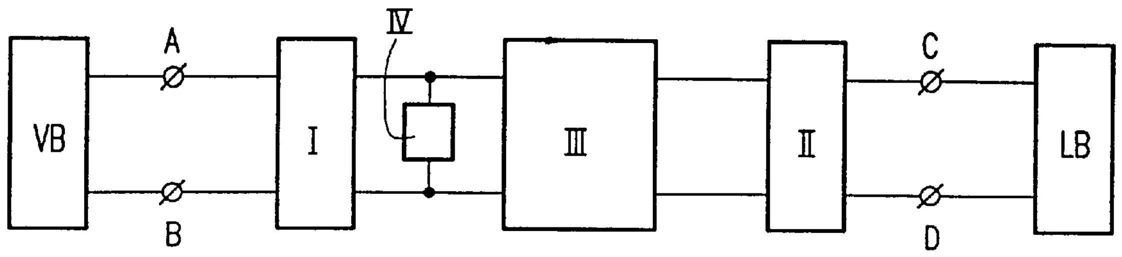
FIG. 1 is a block diagram of the circuit arrangement.

In FIG. 1, A and B are connection terminals for connecting a supply source VB, for example, provided with a solid state relay. Reference I denotes input filter means and III, a converter with a control circuit. C and D form output terminals for connecting the semiconductor light source LB. II denotes voltage detection means for the detection of the voltage at the output terminals. A self-regulating current limitation network IV is connected between the input filter means I and the converter III. The converter III, preferably, is a switch mode power supply fitted with one or several semiconductor switches.

Figure 2:
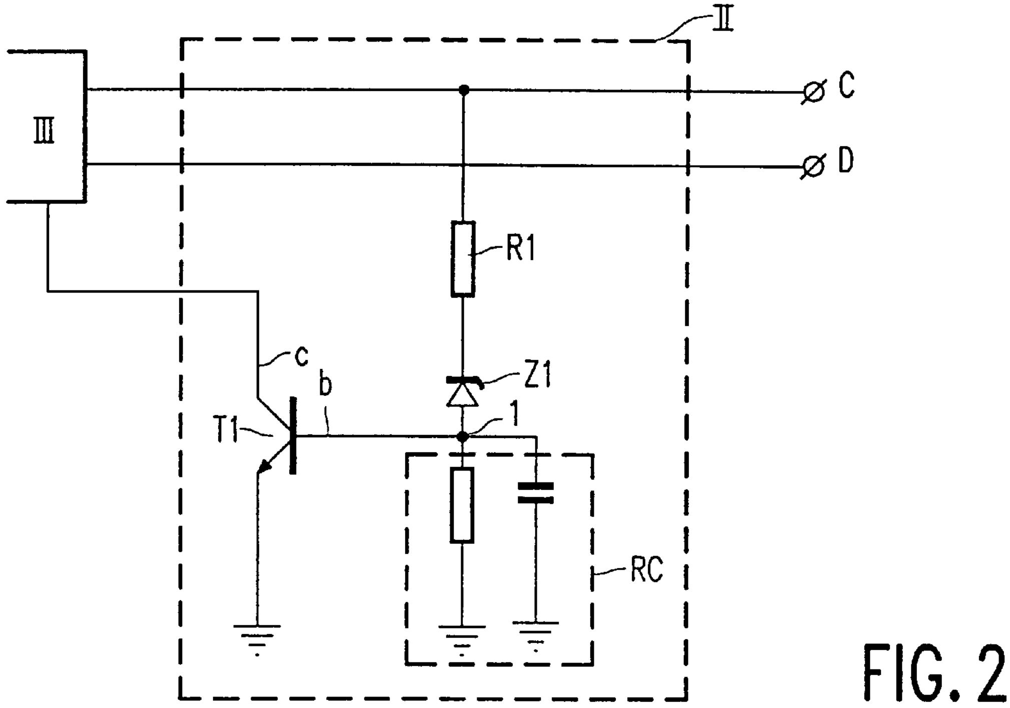
FIG. 2 is a more detailed circuit diagram of voltage detection means for the detection of voltage.

FIG. 2 shows a more detailed diagram of the voltage detection means, which comprises a voltage divider branch consisting of a resistor R1, a zener diode Z1, and an RC network RC. Between the zener diode Z1 and the RC network RC, there is a junction point 1 to which a base b of a transistor T1 is connected for generating a signal S if a voltage Vu appears at the output terminals which is higher than a threshold voltage Vud. The threshold voltage here is defined by the zener voltage of the zener diode Z1. The moment the output voltage Vu becomes higher than the threshold voltage Vud, a signal S will appear at a collector c of the transistor T1. This signal S is conducted to the control circuit of the converter III.

Figure 3:
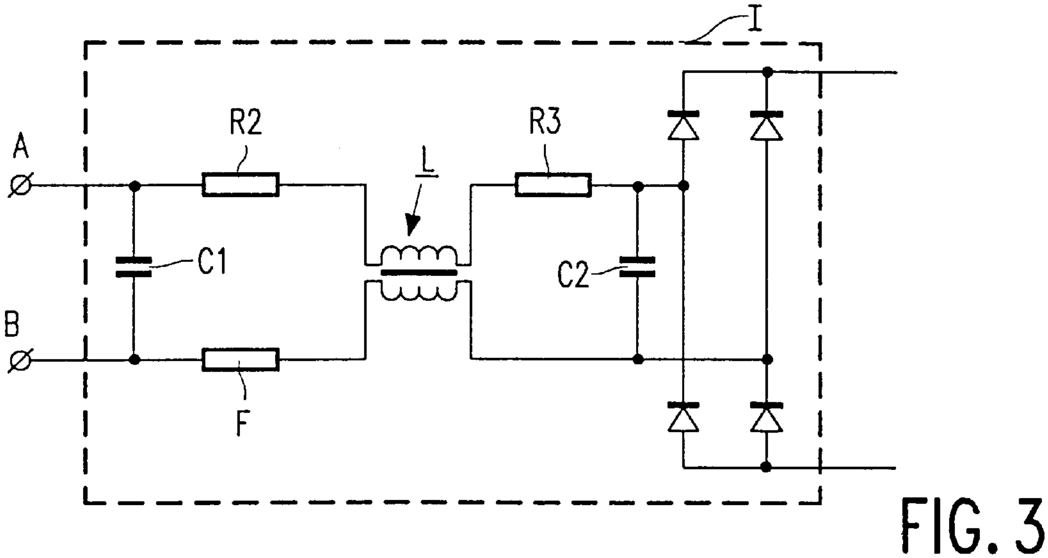
FIG. 3 shows the input filter means in detail.

The input filter means I is shown in detail in FIG. 3 and comprises two coupled self-inductances L which, together with capacitors C1, C2 and resistors R2, R3, form a filter for suppressing electromagnetic interference. A fuse F also forms part of the input filter means, acting as a disconnecting means therein. The disconnecting means thus forms switching means for switching the converter into an operational state for which it is true that Vu<Vud. The signal S, which is conducted to the control circuit of the converter III, serves to operate the converter in an operational state which leads to an activation of the disconnecting means.

In a practical realization of the embodiment of the circuit arrangement according to the invention as described above, this circuit arrangement is suitable for connection to a supply source with a voltage of at least 80 V, 60 Hz, and at most 135 V, 60 Hz, and is suitable for operating a semiconductor light source comprising a matrix of 3×6 LEDs, made by Hewlett-Packard, with a forward voltage $V_F$ of between 2 V and 3 V, defined at 250 mA and at an ambient temperature of 25° C. The embodiment described is highly suitable for use as a traffic light in a traffic control system.

The converter III is formed by a switched mode power supply provided with a semiconductor switch. The zener diode Z1 of the voltage detection means II has a zener voltage of 27 V. The resistor R1 has a value of 1 kΩ. The transistor T1 is of the BCX70 type (made by Philips). The RC network RC comprises a parallel arrangement of a 10 kΩ resistor and a 10 nF capacitor. The transistor T1 will become conducting and current will start to flow through the collector c as soon as the output voltage Vu is and remains higher than 27 V. This current through the collector c forms the signal S. In the embodiment described here, the collector c is connected to a trigger input of an IC of the TLP555 type (made by TI), which forms part of the control circuit of the switch mode power supply. This achieves that the semiconductor switch of the switched mode power supply is so switched that the switched mode power supply draws a continuous strong current from the supply source.

The two coupled self-inductances L of the input filter means I each has a value of 1.5 $\mu$H, the capacitors C1 and C2 each have a value of 100 nF, and the resistors R2 and R3, a value of 5.6 Ω each. The fuse F, which forms part of the input filter means, is formed by a fusistor of 10 Ω, type NFR25H, made by Philips.

The circuit arrangement, provided with a housing, forms part of a signaling light which is provided with a housing containing a semiconductor light source, the housing of the circuit arrangement being integrated with the housing of the signaling light. The embodiment described is highly suitable for use as a traffic light in a traffic control system.

We claim:

1. A circuit arrangement suitable for operating a semiconductor light source, said circuit arrangement comprising:

input terminals for connecting a supply voltage;

input filter means;

a converter comprising a control circuit; and output terminals for connecting the semiconductor light source, wherein said converter generates a current for application to said semiconductor light source, and said control circuit controls said converter to produce a predetermined value of said current at said output terminals, said predetermined value of said current corresponding to an output voltage which is less than a predetermined threshold voltage, characterized in that the circuit arrangement further comprises voltage detection means for detecting the output voltage at the output terminals, said voltage detection means generating a detection signal when the output voltage exceeds said predetermined threshold voltage.

2. A circuit arrangement as claimed in claim 1, characterized in that the input filter means includes switching means for switching the converter into an operational state in which the output voltage is made less than the threshold voltage.

3. A circuit arrangement as claimed in claim 2, characterized in that the switching means comprises disconnecting means for disconnecting the converter from said supply voltage, and the detection signal causes the converter to operate in a state such that the disconnecting means is activated.

4. A circuit arrangement as claimed in claim 3, characterized in that the disconnecting means is constructed as a fuse.

5. A circuit arrangement as claimed in claim 1, characterized in that the circuit arrangement is suitable for connection to a solid state relay, and in that a self-regulating current limitation network is connected between the input filter means and the converter.

6. A signaling light provided with a housing containing a semiconductor light source, characterized in that the signaling light is provided with a circuit arrangement for operating the semiconductor light source, said circuit arrangement comprising:

input terminals for connecting a supply voltage;

input filter means;

a converter comprising a control circuit; and output terminals for connecting the semiconductor light source, wherein said converter generates a current for application to said semiconductor light source, and said control circuit controls said converter to produce a predetermined value of said current at said output terminals, said predetermined value of said current corresponding to an output voltage which is less than a predetermined threshold voltage, characterized in that the circuit arrangement further comprises voltage detection means for detecting the output voltage at the output terminals, said voltage detection means generating a detection signal when the output voltage exceeds said predetermined threshold voltage.

7. A signaling light as claimed in claim 6, characterized in that the circuit arrangement is provided with a housing which is integrated with the housing of the signaling light.

* * * * *